(12) United States Patent
Zang et al.

(10) Patent No.: US 11,843,019 B2
(45) Date of Patent: Dec. 12, 2023

(54) PIXEL, ASSOCIATED IMAGE SENSOR, AND METHOD

(71) Applicant: OmniVision Technologies, Inc., Santa Clara, CA (US)

(72) Inventors: Hui Zang, San Jose, CA (US); Cunyu Yang, Los Gatos, CA (US); Gang Chen, San Jose, CA (US)

(73) Assignee: Omni Vision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/689,847

(22) Filed: Nov. 20, 2019

(65) Prior Publication Data

US 2021/0151494 A1    May 20, 2021

(51) Int. Cl.
*H01L 27/146* (2006.01)

(52) U.S. Cl.
CPC .. *H01L 27/14645* (2013.01); *H01L 27/14603* (2013.01); *H01L 27/14683* (2013.01)

(58) Field of Classification Search
CPC ................................................. H01L 27/14614
USPC .......................................................... 257/292
See application file for complete search history.

(56) References Cited

U.S. PATENT DOCUMENTS

| | | | |
|---|---|---|---|
| 2005/0017316 A1* | 1/2005 | Yaung | H01L 27/14689 257/435 |
| 2010/0117126 A1* | 5/2010 | Takahashi | H01L 27/1463 257/292 |
| 2011/0089311 A1 | 4/2011 | Venezia et al. | |
| 2011/0156186 A1* | 6/2011 | Iida | H01L 27/1464 257/432 |
| 2013/0175582 A1 | 7/2013 | Ihara et al. | |
| 2015/0132882 A1 | 5/2015 | Hisanori | |
| 2016/0013240 A1 | 1/2016 | Jung et al. | |
| 2016/0343706 A1* | 11/2016 | Chang | H01L 27/0207 |
| 2016/0343751 A1 | 11/2016 | Sze et al. | |
| 2018/0061875 A1 | 3/2018 | Roy | |

(Continued)

FOREIGN PATENT DOCUMENTS

EP          2487714 B1     12/2018
JP       2010073840 A  *   4/2010

OTHER PUBLICATIONS

Machine translation of Manda, JP 2010-073840 (Year: 2010).*
U.S. Appl. No. 16/689,938 Final Office Action dated Aug. 24, 2021, 16 pages.

*Primary Examiner* — Hsin Yi Hsieh
(74) *Attorney, Agent, or Firm* — COZEN O'CONNOR

(57) ABSTRACT

A pixel includes a semiconductor substrate, a low-κ dielectric, and a photodiode region in the semiconductor substrate. The semiconductor substrate has a substrate top surface that forms a trench. The trench extends into the semiconductor substrate and has a trench depth relative to a planar region of the substrate top surface surrounding the trench. The low-κ dielectric is in the trench between the trench depth and a low-κ depth with respect to the planar region. The low-κ depth is less than the trench depth. The photodiode region is in the semiconductor substrate and includes (i) a bottom photodiode section beneath the trench and (ii) a top photodiode section adjacent to the trench. The top photodiode section begins at a photodiode depth, with respect to the planar region, that is less than the low-κ depth, and extends toward and adjoining the bottom photodiode section.

10 Claims, 4 Drawing Sheets

(56) References Cited

U.S. PATENT DOCUMENTS

2018/0301502 A1* 10/2018 Lee .................... H01L 27/1463
2020/0176500 A1    6/2020 Sze et al.

* cited by examiner

PIXEL, ASSOCIATED IMAGE SENSOR, AND METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode region, a floating diffusion region, and a transfer gate. The transfer gate controls current flow from the photodiode region to the floating diffusion region and may include a field-effect transistor. The electric potential of the photodiode region exceeds that of the floating diffusion region. Light reaching the photodiode region generates photoelectrons. Turning on the transfer gate forms a conducting channel that allows the accumulated photoelectrons to transfer or flow from photodiode region to the floating diffusion region. When the transfer gate is pulsed to an off-state, the potential barrier is higher than that of the photodiode region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident reaching the pixel array. Such a horizontal orientation limits how much the pixel density can be decreased. Hence, one way to increase pixel density is to orient the photodiode, transfer gate, and floating diffusion in a direction that has a vertical component. Such transfer gates are examples of vertical transfer gates.

SUMMARY OF THE EMBODIMENTS

While vertical transfer gates enable increased pixel density, pixels with vertical transfer gates are vulnerable to electron transport lag and dark current, both of which produce image artifacts. Electron transport lag can create black dots in still images and ghost images in video. Dark current produces bright artifacts in images. Embodiments disclosed herein ameliorate these problems.

A pixel includes a semiconductor substrate, a low-κ dielectric, and a photodiode region in the semiconductor substrate. The semiconductor substrate has a substrate top surface that forms a trench. The trench extends into the semiconductor substrate and has a trench depth relative to a planar region of the substrate top surface surrounding the trench. The low-κ dielectric is in the trench between the trench depth and a low-κ depth. The low-κ depth is less than the trench depth with respect to the planar region. The photodiode region is in the semiconductor substrate and includes (i) a bottom photodiode section beneath the trench and (ii) a top photodiode section adjacent to the trench. The top photodiode section begins at a photodiode depth, with respect to the planar region, that is less than the low-κ depth, and extends toward and adjoining the bottom photodiode section.

A pixel fabrication method includes lining a surface of a trench with an etch-stop layer. The trench extends into a top surface of a semiconductor substrate and has a trench depth relative to a planar region of the top surface surrounding the trench. The semiconductor substrate includes a photodiode region located adjacent to the trench. The photodiode region is formed at a photodiode depth and extends away from the planar region. Relative to the planar region, the photodiode depth is less than the trench depth. The method also includes (a) partially filling the trench with a low-κ dielectric to a low-κ depth, with respect to the planar region, that is less than the trench depth; (b) removing the etch-stop layer between the low-κ depth and the planar region; and (c) depositing a dielectric layer on the surface of the trench at depths between the planar region and the low-κ depth.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
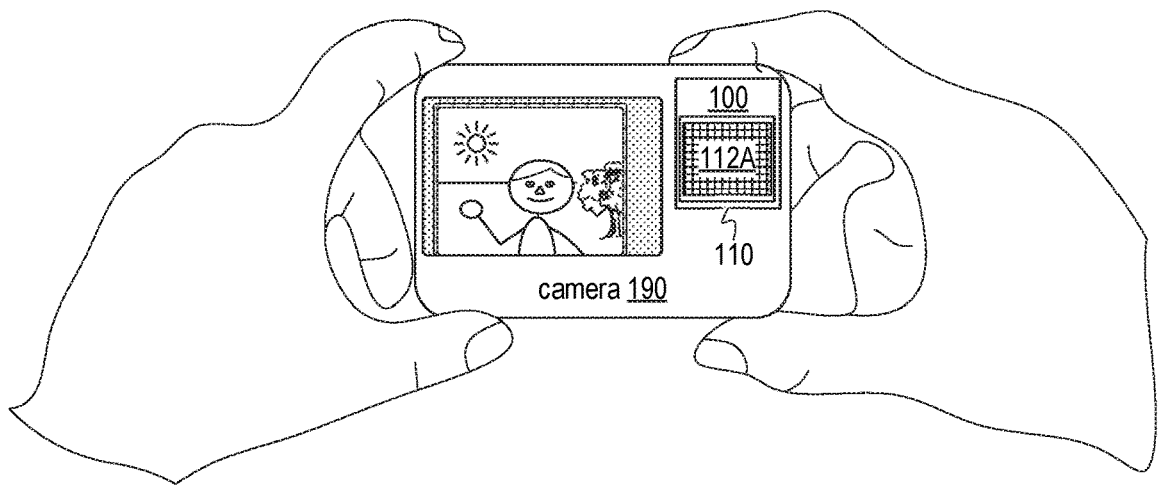
FIG. 1 depicts a camera imaging a scene.

FIG. 1 depicts a camera 190 imaging a scene. Camera 190 includes an image sensor 100, which includes a semiconductor substrate 110. Constituent elements of semiconductor substrate 110 may include silicon and germanium. Semiconductor substrate 110 includes a pixel array 112A. Image sensor 100 may part of a chip-scale package or a chip-on-board package.

Figure 2A:
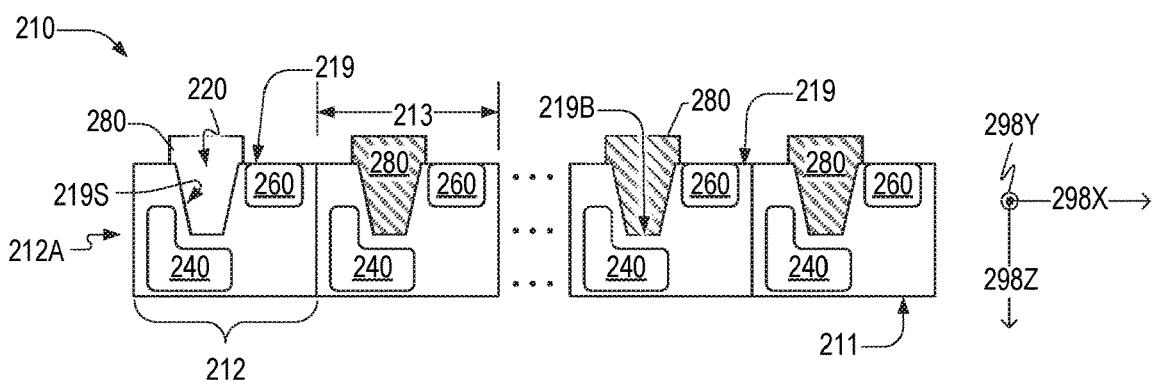
FIG. 2A is a cross-sectional schematic of a semiconductor substrate, which is an embodiment of the semiconductor substrate of the camera of FIG. 1.

FIG. 2A is a cross-sectional schematic of a semiconductor substrate 210, which is an example of semiconductor substrate 110 of image sensor 100. Semiconductor substrate 210 includes at least one of silicon and germanium. The cross-section illustrated in FIG. 2A is parallel to a plane, hereinafter the x-z plane, formed by orthogonal directions 298X and 298Z, which are each orthogonal to direction 298Y. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto. Herein, reference to an axis x, y, or z or associated direction ±x, ±y, or ±z refers to directions 298X, 298Y, and 298Z respectively. Also, herein, a horizontal plane is parallel to the x-y plane, a width refers to an objects extension in the y direction, and vertical refers to the z direction.

Semiconductor substrate 210 has a bottom substrate surface 211 and a top substrate surface 219, each of which may be perpendicular to direction 298Z. Herein, top substrate surface 219 may be referred to as the front side surface of semiconductor substrate 210. Herein, top substrate surface 219 may be referred as the non-illuminated surface of semiconductor substrate 210 and bottom substrate surface 211 opposite to top substrate surface 219 may be referred to as the illuminated surface of semiconductor substrate 210. Semiconductor substrate 210 includes a plurality of pixels 212 that form a pixel array 212A, which is an example of pixel array 112A. The plurality of pixels 212 are arranged in a plurality of rows and columns in directions 298X and 298Y respectively. Pixel array 212A has a pixel pitch 213 in direction 298X. In direction 298Y pixel array 212A has pitch $P_y$ that, in embodiments, equals pixel pitch 213. In embodiments, pixel pitch 213 is less than 1.1 μm, for example, pixel pitch 213 may equal 0.9 μm.

Figure 2B:
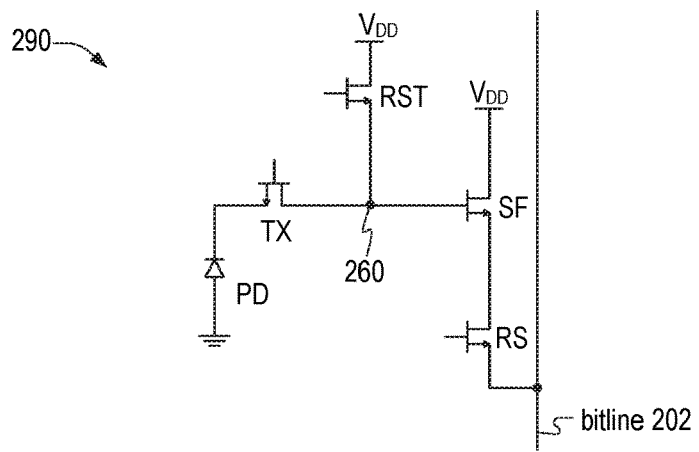
FIG. 2B is a circuit diagram of a four-transistor ("4T") pixel, which is a candidate pixel circuitry architecture of a pixel of FIG. 2A.

FIG. 2B is a circuit diagram of a four-transistor ("4T") pixel 290, which is a candidate pixel circuitry architecture of pixel 212. Pixel 290 includes a photodiode PD, a transfer transistor TX, a reset transistor RST, a source follower transistor SF, a row select transistor RS. Pixel 290 is electrically connected to a bitline 202 of image sensor 100. FIGS. 2A and 2B are best viewed together in the following description.

Each pixel 212 includes a respective photodiode region 240 of a respective photodiode PD, a vertical transfer gate 280 of a respective transfer transistor (e.g., transfer transistor TX), and a respective floating diffusion region 260. Photodiode region 240 of each pixel 212 is configured to generate and accumulate charges in respond to incoming light, for example entered from bottom substrate surface 211 of semiconductor substrate 210 (e.g., backside surface of semiconductor substrate 210) during an integration period of the image sensor 100. Electrical connection of photodiode region 240 to floating diffusion region 260 depends on voltage applied to vertical transfer gate 280. Charges, e.g., photoelectrons, accumulated in photodiode region 240 (e.g., source of transfer transistor TX), for example during an integration period of image sensor 100, can be selectively transferred to floating diffusion region 260 (e.g., drain of transfer transistor TX) depending on voltage applied to vertical transfer gate 280 of the transfer transistor (e.g., transfer transistor TX) associated with pixel 212. The photodiode region 240 may be in form of various configurations including pinned photodiode configuration, partially pinned photodiode configuration.

Each vertical transfer gate 280 of the transfer transistor (e.g., vertical gate portion of transfer transistor TX) is formed in a respective trench 220 formed by top substrate surface 219. Trench 220 includes side surfaces 219S and a bottom surface 219B. While some photoelectrons flow through side surfaces 219S to floating diffusion region 260. However, other photoelectrons are trapped at bottom surface 219B such that they are unlikely to reach floating diffusion region 260 within their lifetime. These trapped electrons result in the aforementioned image artifacts.

In embodiments, each pixel 212 is a four-transistor pixel or 4T pixel and further includes a reset transistor RST, a source follower transistor SF and a row select transistor RS. The reset transistor RST is coupled between a power line and the floating diffusion 260 to reset (e.g., discharge or charge floating diffusion 260 region to a preset voltage e.g., a supply voltage $V_{DD}$) under control of a reset signal during a reset period. The reset transistor RST is further coupled to photodiode region 240 of photodiode PD through the transfer transistor TX to selective reset photodiode region 240 to the preset voltage during the reset period. Floating diffusion region 260 is coupled to a gate of the source follower transistor SF. The source follower transistor is coupled between the power line and the row select transistor RS. The source follower transistor SF operates to modulate the image signal output based on the voltage of floating diffusion region 260 received, where the image signal corresponds to the amount photoelectrons accumulated in photodiode region 240 during the integration period at the gate thereof. The row select transistor RS selectively couples the output (e.g., image signal) of the source follower transistor RS to the readout column line under control of a row select signal.

In operation, during the integration period (also referred to as an exposure or accumulation period) of image sensor 100, photodiode region 240 of photodiode PD detects or absorbs light incident on pixel 212. The photogenerated charge accumulated in photodiode region 240 is indicative of the amount of light incident on photodiode region 240 of photodiode PD. After the integration period, the transfer transistor TX transfers the photogenerated charge to floating diffusion region 260 upon reception of a transfer signal (e.g., a positive biasing voltage) at vertical transfer gate 280. The source follower transistor SF generates the image signal. The row select transistor RS coupled to the source follower transistor then selectively reads out the signal onto a column bit line for subsequent image processing.

The disclosed vertical transfer gate structure may apply to any of a variety of additional or alternative types of pixel cell, e.g. a five-transistor pixel cell, or a six-transistor pixel cell and/or the like.

Figure 3:
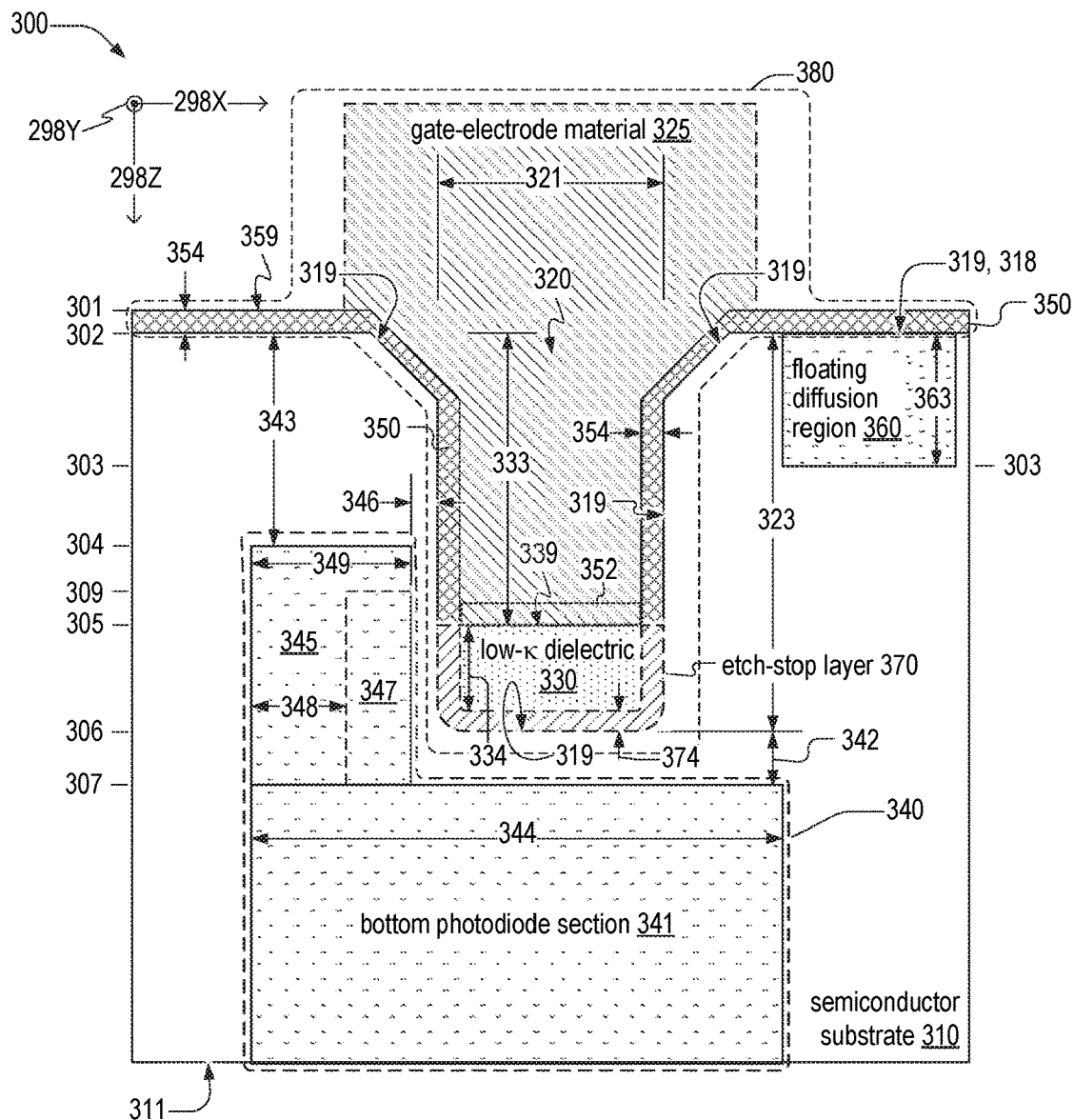
FIG. 3 is a cross-sectional schematic of a pixel, which is an example of a pixel formed in the semiconductor substrate of FIG. 2A, in an embodiment.

FIG. 3 is a cross-sectional schematic of a pixel 300, which is an example of pixel 212. Pixel 300 is formed in a semiconductor substrate 310, which is an example of semiconductor substrate 210, FIG. 2A. Pixel 300 includes a trench 320, a low-κ dielectric 330, and a photodiode region 340. In embodiments, pixel 300 includes at least one of a floating diffusion region 360, a gate-electrode material 325, and a dielectric layer 350. Each of low-κ dielectric 330 and dielectric layer 350 may include at least one of a nitride material and an oxide material. Gate-electrode material 325 may include at least one of polysilicon and a metal. In one embodiment, low-κ dielectric 330 and dielectric layer 350 are formed of the same material, but of different thickness to modulate capacitance associated with different portions or segments of vertical transfer gate 280.

In embodiments, semiconductor substrate 310 is p-doped, photodiode region 340 is n-doped, and floating diffusion region 360 is n$^+$-doped. In embodiments, floating diffusion region 360 has a dopant concentration between $10^{19}$ and $5 \times 10^{20}$ charge carriers per cubic centimeter.

Semiconductor substrate 310 has a surface 319 that forms trench 320. Surface 319 includes a planar region 318 surrounding trench 320. Trench 320 extends into semiconductor substrate 310 to a trench depth 323 relative to planar region 318. Surface 319 is an example of top substrate surface 219. A bottom region (e.g., region between planes 305 and 306) of trench 320 has low-κ dielectric 330 disposed therein functions as a capacitor with a low capacitance relative to regions of trench 320 above low-κ dielectric 330, and thereby inhibits vertical flow of photoelectrons between photodiode region 340 and gate-electrode material 325 near the bottom of trench 320, and hence prevents the aforementioned image artifacts. Herein and per convention, a low-κ dielectric is a dielectric material that has dielectric constant κ<3.9, which is the dielectric constant of silicon dioxide. A high-κ dielectric is a dielectric material that has dielectric constant greater than κ>7, which is the dielectric constant of silicon nitride. Examples of high-κ dielectrics include, but are not limited to, aluminum oxide ($Al_2O_3$), hafnium oxide $HfO_2$, tantalum oxide ($Ta_2O_5$), zirconium oxide $ZrO_2$ and combinations thereof.

In embodiments, trench depth 323 is between 0.1 and 0.9 micrometers. In at least one of directions 298X and 298Y, trench 320 has a width 321, which may be between fifty nanometers and 0.3 micrometers. In embodiments, trench 320 has a non-uniform width between planar region 318 and its bottom at trench depth 323. Accordingly, width 321 may be a width of trench 320 at a depth equal to one-half of trench depth 323. Semiconductor substrate 310 has a bottom substrate surface 311, which is an example of bottom substrate surface 211, FIG. 2A.

Photodiode region 340 is an example of photodiode region 240, FIG. 2A, and includes a bottom photodiode section 341 beneath trench 320 and a top photodiode section 345 adjacent to trench 320. Top photodiode section 345 is formed at a photodiode depth 343, with respect to planar region 318, is less than the trench depth 323, and extends toward bottom substrate surface 311 to a horizontal plane 307. Bottom photodiode section 341 adjoins top photodiode section 345 at horizontal plane 307 and extends away from planar region 318 toward bottom substrate surface 311. Horizontal plane 307 is perpendicular to direction 298Z.

In addition to horizontal plane 307, FIG. 3 denotes six other horizontal planes 301-306, each of which is perpendicular to direction 298Z. Plane 301 corresponds to a top surface 359 of dielectric layer 350 above planar region 318. Plane 302 includes planar region 318. Planes 302 and 303 are vertically separated by junction depth 363. Planes 302 and 304 are vertically separated by photodiode depth 343. Planes 302 and 306 are vertically separated by trench depth 323. Horizontal planes 306 and 307 are separated by a distance 342.

Bottom photodiode section 341 has a width 344 that exceeds a width 349 of top photodiode section 345. In embodiments, top photodiode section 345 has a non-uniform width a function of direction 298Z. For example, FIG. 3 depicts a region 347 within photodiode section 345 and spanning between plane 307 and a horizontal plane 309. Horizontal plane 309 may be between planes 304 and 305, or between planes 305 and 306. In embodiments, top photodiode section 345 does not include region 347, such that top photodiode section 345 has width 349 between planes 304 and 309, and has a narrower width 348 between planes 309 and 307, where width 349 exceeds width 348.

However, by inhibiting current flow between photodiode region 340 and gate-electrode material 325 near the bottom of trench 320, low-κ dielectric 330 enables top photodiode section 345 to be closer, in horizontal directions, to trench 320 than would otherwise be possible. Accordingly, top photodiode section 345 may have uniform width 349, and formation of such a photodiode region requires fewer process steps than does forming top photodiode section 345 with two widths 349 and 348. Top photodiode section 345 is separated from surface 319 by a minimum distance 346 in horizontal directions. In embodiments, minimum distance 346 is between one nanometer and twenty nanometers to enable charge transfer from top photodiode section 345 to gate-electrode material 325.

Trench depth 323 exceeds photodiode depth 343, such that a portion of the trench 320 is coplanar with top photodiode section 345, e.g., at horizontal planes between planes 304 and 306. Bottom photodiode section 341 is separated from surface 319 by distance 342 in the x-y plane. Top photodiode section 345 is separated from surface 319 by photodiode depth 343 in vertical directions (e.g., along direction 298Z).

In embodiments, each of distances 342 and 346 is between thirty nanometers and three-hundred nanometers. Floating diffusion region 360 is formed in semiconductor substrate 310, adjacent to trench 320 and extends away from planar region 318 to a junction depth 363 that is less than trench depth 323. In embodiments, the junction depth 363 is also less than a low-κ depth 333 with respect to planar region 318.

Dielectric layer 350 lines trench 320 between low-κ depth 333 and planar region 318. Gate-electrode material 325 fills trench 320 between a low-κ depth 333 and planar region 318. Trench 320, dielectric layer 350, low-κ dielectric 330, and gate-electrode material 325 collectively form a vertical transfer gate 380 of a transfer transistor of vertical gated pixel 300. Vertical transfer gate 380 is electrically connected to photodiode region 340. Vertical transfer gate 380 is an example of vertical transfer gate 280, FIG. 2A. Because low-κ dielectric 330 in the bottom region of trench 320 disables the capacitor (e.g., a second capacitor) formed at the bottom of vertical transfer gate 380, such that photocurrent traverses only through the conduction channel formed near the vertical (or near-vertical) sidewalls of trench 320 (between planes 303 and 305, for example) when vertical transfer gate 380 is biased (e.g., by a positive voltage) to turn on the transfer transistor.

Low-κ dielectric 330 is in trench 320 between trench depth 323 and low-κ depth 333 thereabove. In direction 298Z, low-κ dielectric 330 has a thickness 334 that is less than trench depth 323. In embodiments, thickness 334 is between ten nanometers and two-hundred nanometers. This thickness range results in low-κ dielectric 330, semiconductor substrate 310, and gate-electrode material 325 to function as a capacitor that has sufficiently low capacitance to prevent trapped photoelectrons at the bottom of trench 320.

Restated, trench 320, dielectric layer 350, gate-electrode material 325, and semiconductor substrate 310 may collectively form a first capacitor having a first capacitance. Trench 320, low-κ dielectric 330, gate-electrode material 325, and semiconductor substrate 310 may collectively form a second capacitor having a second capacitance being sufficient lower than the first capacitance such that photoelectrons are attracted to travel through the conduction channel path formed around the sidewalls of vertical transfer gate 380 to floating diffusion region 360 when vertical transfer gate 380 is biased to turn on, and no photoelectrons travel through the bottom of trench 320.

Low-κ dielectric 330 has a top surface 339. In embodiments, low-κ depth 333 between planar region 318 and top surface 339 exceeds photodiode depth 343 with respect to planar region 318, such that low-κ dielectric 330 does not impede current flow between top photodiode section 345 and gate-electrode material 325. For example, a difference between photodiode depth 343 and low-κ depth 333 may be between ten nanometers and two-hundred nanometers. In embodiments, thickness 334 is less than half of trench depth 323, which may result in low-κ depth 333 exceeding photodiode depth 343 with respect to planar region 318. In such embodiments, photoelectrons accumulated in bottom photodiode section 341 can travel from top photodiode section 345 through the conduction channel region formed on the sidewalls of vertical transfer gate 380 to floating diffusion region 360 during charge transfer operation.

In embodiments, top surface 339 of low-κ dielectric 330 is planar, as illustrated in FIG. 3. In embodiments, low-κ dielectric 330 is either concave or conformal to surface 319 while also exceeding a minimum thickness (in compliance with fabrication limitations) such that its capacitance is sufficiently low to prevent photoelectrons from being trapped at the bottom of trench 320.

In embodiments, pixel 300 includes an etch-stop layer 370. Etch-stop layer 370 lines trench 320 between low-κ dielectric 330 and surface 319 of semiconductor substrate 310, e.g., between horizontal planes 305 and 306. In embodiments, etch-stop layer 370 has a higher etch selectivity than low-κ dielectric 330, where etch selectivity is relative to semiconductor substrate 310. That is, for a given etchant, etch-stop layer 370 has an etch rate that exceeds an etch rate of low-κ dielectric 330, such that, in embodiments, semiconductor substrate 310 is not damaged while in a process of forming a recess for low-κ dielectric 330. The process may include reactive ion etching. Etch-stop layer 370 has a thickness 374, which may be between one nanometer and twenty-one nanometers.

In embodiments, etch-stop layer 370 is formed of a high-κ dielectric, a benefit of which is reduced dark current. High-κ materials have negative fixed charges (depending on thickness) that can form a hole accumulation layer to passivate sidewalls of the bottom of trench 320 close to photodiode region 340. The hole-accumulation layer reduces dark current by preventing electric charges generated from traps/defects formed at the interface between trench 320 and semiconductor substrate 310, for example during trench etching process, being detected as dark current.

Dielectric layer 350 has a thickness 354, which may be between two nanometers and ten nanometers. In an embodiment, thickness 354 is 7.5 nanometers. In embodiments, dielectric layer 350 includes a section 352, which covers top surface 339 of low-κ dielectric 330.

Low-κ dielectric 330 functions as a capacitor dielectric between gate-electrode material 325 and semiconductor substrate 310, where parts of gate-electrode material 325 and semiconductor substrate 310 adjacent to low-κ dielectric 330 function as capacitor electrodes. The resulting capacitor has a capacitance $C_{330} = \epsilon_0 \kappa_{330}/t_{330}$, where $\epsilon_0$ is the permittivity of free space, $\kappa_{330}$ is the dielectric constant of low-κ dielectric 330, and $t_{330}$ equals thickness 334. When low-κ dielectric 330 includes air gaps or pores, dielectric constant $\kappa_{330}$ is an effective dielectric constant of the material forming low-κ dielectric 330 and the voids therein.

Etch-stop layer 370 functions as a capacitor dielectric between gate-electrode material 325 and semiconductor substrate 310 each functioning as capacitor electrodes. The resulting capacitor has a capacitance $C_{370} = \epsilon_0 \kappa_{370}/t_{370}$, where $\kappa_{370}$ is the dielectric constant of etch-stop layer 370 and $t_{370}$ equals thickness 374. Dielectric layer 350 functions as a capacitor dielectric between gate-electrode material 325 and semiconductor substrate 310 where parts of gate-electrode material 325 and semiconductor substrate 310 adjacent to dielectric layer 350 function as capacitor electrodes. The resulting capacitor has a capacitance $C_{350} = \epsilon_0 \kappa_{350}/t_{350}$, where $\kappa_{350}$ is the dielectric constant of dielectric layer 350 and $t_{350}$ equals thickness 354. In embodiments, quotient $\kappa_{330}/t_{330}$ is less than at least one of quotient $\kappa_{370}/t_{370}$ and quotient $\kappa_{350}/t_{350}$. In embodiments, the equivalent series capacitance of capacitance $C_{330}$ and capacitance $C_{370}$ is less than the capacitance $C_{350}$: $(1/C_{330}+1/C_{370})^{-1} < C_{350}$. In embodiments, low-κ dielectric 330 and the etch-stop layer 370 are configured in thickness and material characteristic to effectively disable the bottom capacitor of the vertical transfer gate 380 between planes 305 and 306. As a result, photogenerated electrons are not attracted to travel through the bottom portion of the vertical transfer gate during the charge transfer period where the vertical transfer gate 380 is biased to turn on the respective transfer transistor forming conduction channel for photogenerated electrons to travel through.

Figure 4:
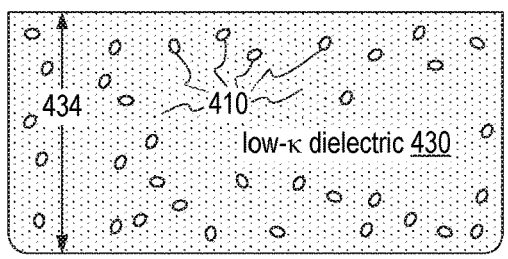
FIG. 4 is a schematic cross-sectional view of a first low-κ dielectric, which is an example of the low-κ dielectric of the pixel of FIG. 3, in an embodiment.

FIG. 4 is a schematic cross-sectional view of a low-κ dielectric 400, which is an example of low-κ dielectric 330. Low-κ dielectric 400 has a thickness 434, which is an example of thickness 334. Low-κ dielectric 400 includes a plurality of pores 410, such that it is a porous dielectric. Pores 410 contribute to low-κ dielectric 400's qualifying as a low-κ dielectric, as the dielectric constant of air is effectively equal to one. Pores 410 may have an average diameter that is less than two nanometers. In embodiments, low-κ dielectric 400 includes at least one of micropores (pore widths less than two nanometers) and macropores (pore widths exceeding one hundred nanometers). In an embodiment, low-κ dielectric 400 is a porous material that includes a solid network and a gas filler. The solid network may be formed of at least one of silica, alumina, and titania.

Figure 5:
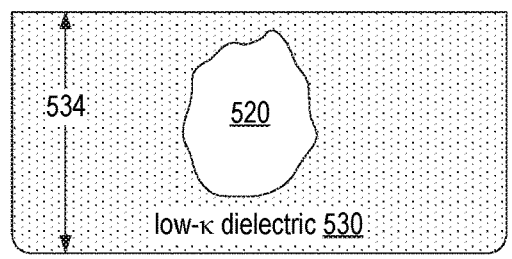
FIG. 5 is a schematic cross-sectional view of a second low-κ dielectric, which is an example of the low-κ dielectric of the pixel of FIG. 3, in an embodiment.

FIG. 5 is a schematic cross-sectional view of a low-κ dielectric 500, which is an example of low-κ dielectric 330. Low-κ dielectric 500 has a thickness 534, which is an example of thickness 334. Low-κ dielectric 500 includes at least one air-gap 520 therein. Air-gap 520 contributes to low-κ dielectric 500's qualifying as a low-κ dielectric, as the dielectric constant of air is effectively equal to one. Air gap 520 may have a diameter that exceeds one-half of thickness 534. In embodiments, low-κ dielectric 500 includes at least one pore 410. In embodiments, low-κ dielectric 400 includes at least one air-gap 520.

Figure 6:
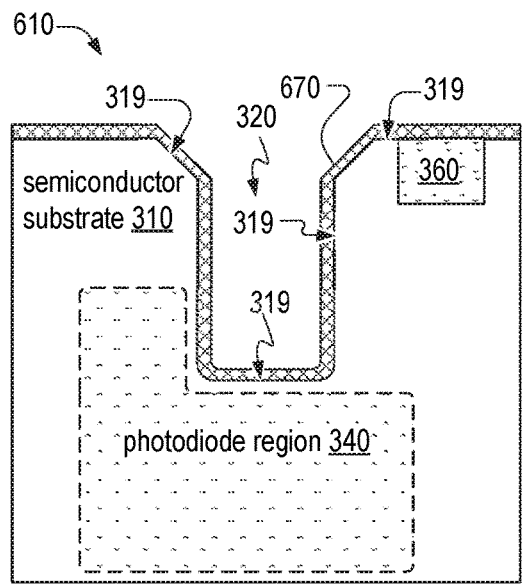
FIGS. 6-9 illustrate respective intermediate substrates attained during an example process for manufacturing the pixel of FIG. 3, in embodiments.

FIGS. 6-9 illustrate respective intermediate substrates attained during an example process for manufacturing pixel 300. FIG. 6 is a cross-sectional schematic of a coated substrate 610, which is semiconductor substrate 310 with an etch-stop layer 670 deposited on surface 319 such that it lines trench 320. In embodiments, etch-stop layer 370 of pixel 300 is formed from etch-stop layer 670.

Figure 7:
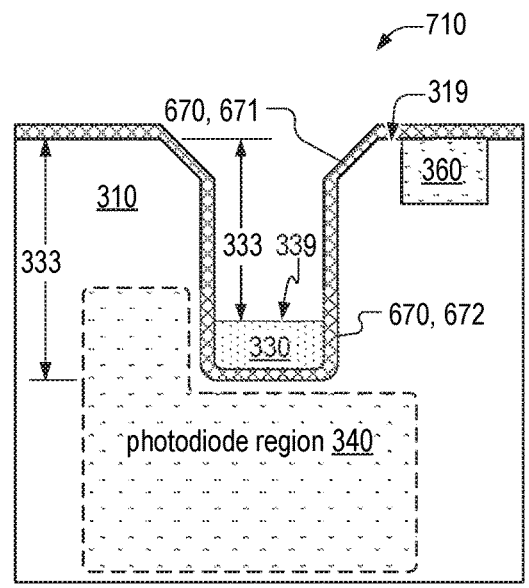

FIG. 7 is a cross-sectional schematic of a coated substrate 710, which is coated substrate 610 with the addition of low-κ dielectric 330 in trench 320 such that part of etch-stop layer 670, referred to as layer section 672, is between surface 319 and low-κ dielectric 330. FIG. 7 denotes a layer section 671, which complements layer section 672 by denoting the remaining part of etch-stop layer 670 not covered by low-κ dielectric 330.

Figure 8:
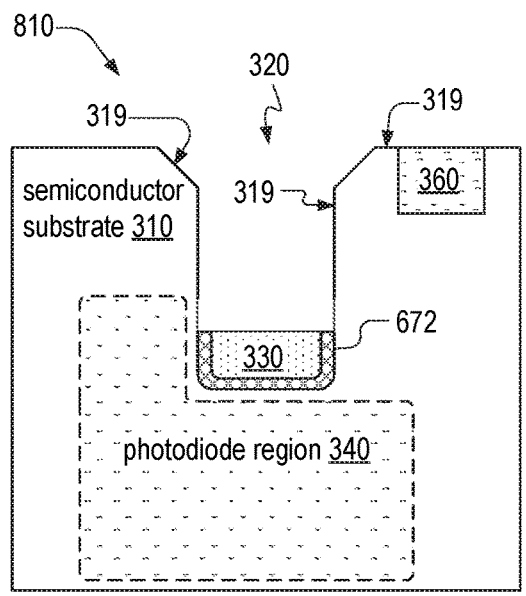

FIG. 8 is a cross-sectional schematic of an etched substrate 810, which is coated substrate 710 after removal of layer section 671. Etched substrate 810 includes layer section 672 between low-κ layer 330 and surface 319.

Figure 9:
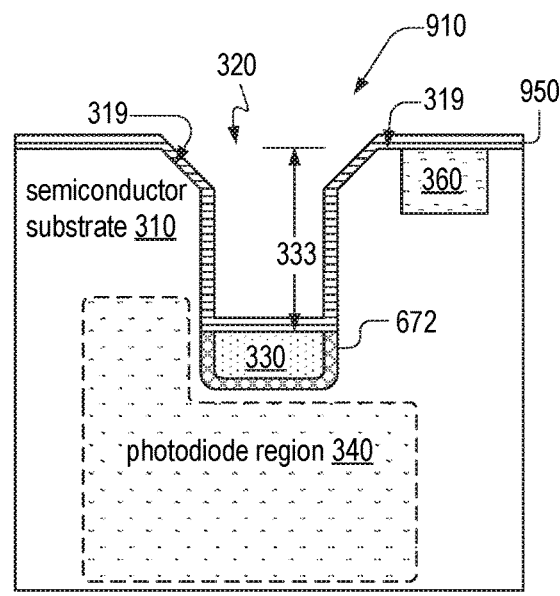

FIG. 9 is a cross-sectional schematic of a coated substrate 910, which is etched substrate 810 after deposition of a dielectric layer 950 on etched substrate 810. Dielectric layer 950 is an example of dielectric layer 350, FIG. 3.

Figure 10:
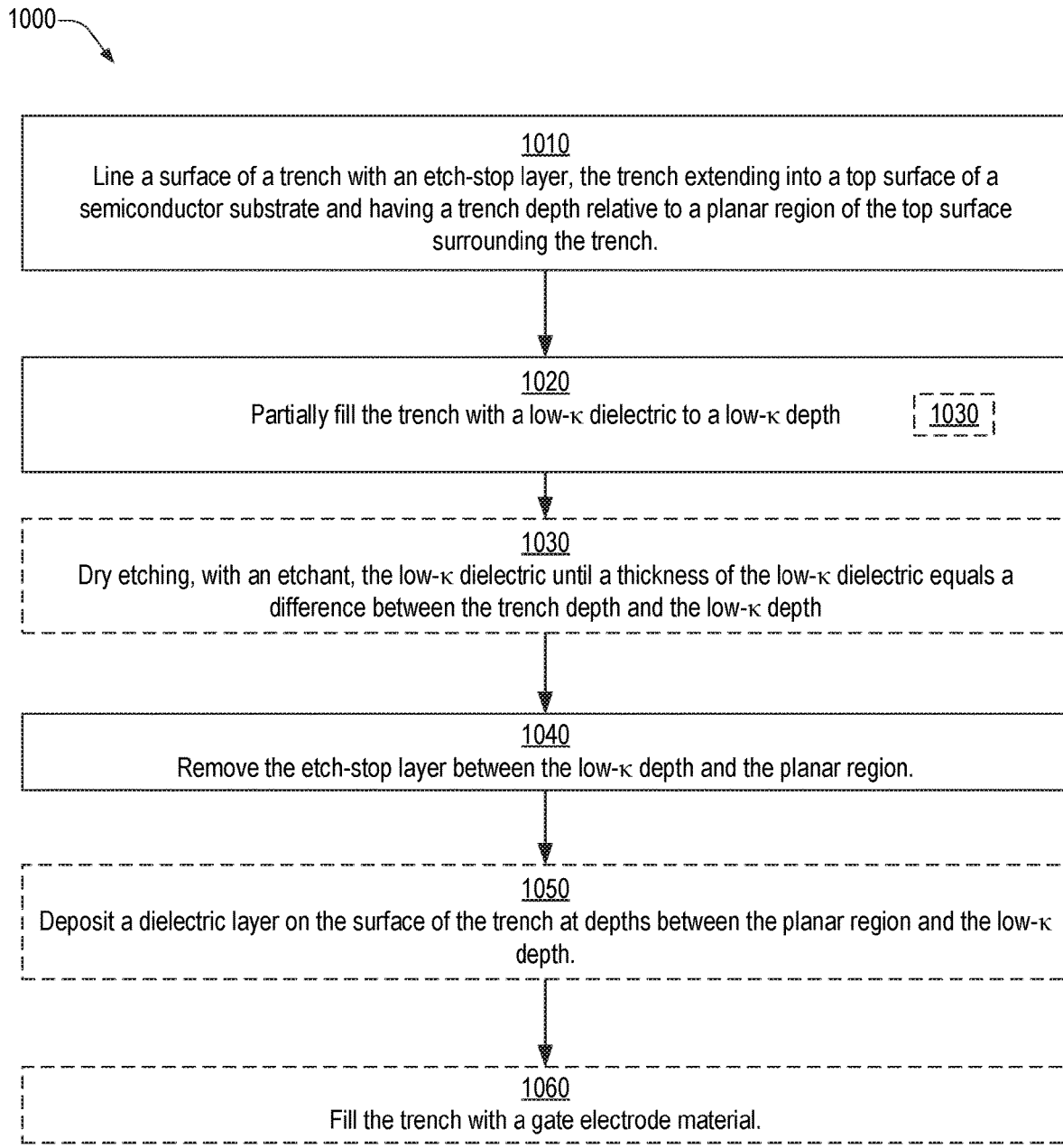
FIG. 10 is a flowchart illustrating a method for fabricating the pixel of FIG. 3, in an embodiment.

FIG. 10 is a flowchart illustrating a method 1000 for fabricating a pixel, such as pixel 300. Method 1000 includes steps 1010, 1020, and 1040. In embodiments, method 1000 also includes at least one of steps 1030, 1050, and 1060.

Step 1010 includes lining a surface of a trench with an etch-stop layer. The trench extends into a top surface of a semiconductor substrate and has a trench depth relative to a planar region of the top surface surrounding the trench. The semiconductor substrate includes a photodiode region located adjacent to the trench. The photodiode region is formed at a photodiode depth and extends away from the planar region. Relative to the planar region, the photodiode depth is less than the trench depth. In an example of step 1010, trench 320 of semiconductor substrate 310 is lined with etch-stop layer 670, which yields coated substrate 610, FIG. 6.

Etch-stop layer 670 may be deposited conformally to the trench structure of trench 320 by the suitable deposition process such as atomic layer deposition (ALD) and plasma enhanced chemical vapor deposition (PECVD). Etch-stop layer 670 may prevent damages to semiconductor substrate 610 during etching process. In one example, etch stop layer 670 is formed of a high-κ dielectric, a benefit of which is to reduce dark current.

Step 1020 includes partially filling the trench with a low-κ dielectric to a low-κ depth that is, with respect to the planar region, less than the trench depth. In an example of step 1020, trench 320 is partially filled with low-κ dielectric 330 to low-κ depth 333, which yields coated substrate 710, FIG. 7. In an example, the low-κ dielectric may be formed using plasma chemical vapor deposition (CVD) process such that the low-κ dielectric may include at least an air gap as illustrated in FIG. 4 and/or FIG. 5.

Step 1030 includes dry etching, with an etchant, the low-κ dielectric until a thickness of the low-κ dielectric equals a difference between the trench depth and the low-κ depth. In step 1030, an etch rate of the low-κ dielectric exceeds, for the etchant, an etch rate of the etch-stop layer such that surrounding semiconductor substrate 310 is protected by the etch stop layer. Step 1030 may be part of step 1020. In embodiments, step 1030 includes dry etching via a reactive-ion etching process, which may be either fluorine-based or chlorine based. In an example of step 1030, the low-κ dielectric material that partially fills trench 320 is dry etched until its thickness is reduced to thickness 334. The dry etching yields low-κ dielectric 330. Thickness 334 equals a difference between trench depth 323 and low-κ depth 333.

Step 1040 includes removing the etch-stop layer between the low-κ depth and the planar region. In embodiments, step 1040 includes removing the etch-stop layer via a wet-etching process. In example of step 1040, layer section 671 of etch-stop layer 670 is removed from surface 319, which yields etched substrate 810, FIG. 8.

Step 1050 includes depositing a dielectric layer on the surface of the trench at depths between the planar region and the low-κ depth. In an example of step 1050, dielectric layer 950 is deposited on surface 319, which yields coated substrate 910, FIG. 9. In one example, the dielectric layer is formed conformally to the sidewalls of trench 320 and the top surface of low-κ depth.

Step 1060 includes filling the trench with a gate electrode material between the low-κ depth and the planar region. Step 1060 occurs after step 1020. In an example of step 1060, trench 320 of coated substrate 910 is filled with gate-electrode material 325, which forms vertical transfer gate 380 for transfer transistor TX. In embodiments, method 1000 includes forming floating diffusion region 360 in semiconductor substrate 310 adjacent to trench 320 by ion implantation, extending away from the planar region to a junction depth that is less than the trench depth, such that method 1000 yields pixel 300, FIG. 3. In pixel 300, photodiode region 340 functions as the source of the transfer transistor TX and floating diffusion region function as the drain of the transfer transistor TX.

Combinations of Features

Features described above as well as those claimed below may be combined in various ways without departing from the scope hereof. The following enumerated examples illustrate some possible, non-limiting combinations:

(A1) A pixel includes a semiconductor substrate, a low-κ dielectric, and a photodiode region in the semiconductor substrate. The semiconductor substrate has a substrate top surface that forms a trench. The trench extends into the semiconductor substrate and has a trench depth relative to a planar region of the substrate top surface surrounding the trench. The low-κ dielectric is in the trench between the trench depth and a low-κ depth. The low-κ depth is less than the trench depth with respect to the planar region. The photodiode region is in the semiconductor substrate and includes (i) a bottom photodiode section beneath the trench and (ii) a top photodiode section adjacent to the trench. The top photodiode section begins at a photodiode depth, with respect to the planar region, that is less than the low-κ depth, and extends toward and adjoins the bottom photodiode section.

(A2) The pixel (A1) may further include (i) a gate-electrode material filling the trench between the low-κ depth and the planar region, and (ii) an oxide layer lining the trench between the low-κ depth and the planar region. The trench, the oxide layer, the low-κ dielectric, and the gate-electrode material collectively form a vertical transfer gate electrically connected to the top photodiode section.

(A3) In any pixel (A2), the gate-electrode material may include at least one of polysilicon and a metal.

(A4) In any of pixels (A2) and (A3), the oxide layer has a dielectric constant $\kappa_O$, a thickness $t_O$, and an oxide-layer capacitance proportional to $\kappa_O/t_O$, the low-κ dielectric has a dielectric constant $\kappa_L$, a thickness $t_L$, and a low-κ capacitance that is proportional to $\kappa_L/t_L$. The low-κ capacitance may be less than the oxide-layer capacitance.

(A5) In any of pixels (A1)-(A4), a thickness of the low-κ dielectric may be between ten nanometers and two-hundred nanometers in a direction perpendicular to the planar region.

(A6) In any of pixels (A1)-(A5), a thickness of low-κ dielectric in a first direction perpendicular to the planar region may be less than one half the trench depth.

(A7) In any of pixels (A1)-(A6), a difference between the photodiode depth and the low-κ depth may be between ten nanometers and two-hundred nanometers.

(A8) In any of pixels (A1)-(A7), in a cross-sectional plane perpendicular to the substrate top surface, the photodiode region may be L-shaped, and the bottom photodiode section may have a first width that exceeds a second width of the top photodiode section in a direction parallel to the substrate top surface.

(A9) Any of pixels (A1)-(A8) may further include a floating diffusion region in the semiconductor substrate, adjacent to the trench and extending away from the planar region to a junction depth that is less than the trench depth.

(A10) In any of pixels (A1)-(A9), the low-κ dielectric may include at least one air-gap therein that has a diameter that exceeds one-half of a thickness of the low-κ dielectric.

(A11) In any of pixels (A1)-(A10), the low-κ dielectric may be formed of a porous material.

(A12) Any of pixels (A1)-(A11) may further include an etch-stop layer lining the trench between the low-κ dielectric and the semiconductor substrate. The etch-stop layer has an etch selectivity that exceeds an etch selectivity of the low-κ dielectric. Each etch selectivity is relative to the semiconductor substrate.

(A13) In any of pixel (A12), a thickness of the etch-stop layer may be between one nanometer and twenty-one nanometers.

(A14) In any of pixels (A12) and (A13), the etch-stop layer may be a high-κ dielectric.

(A15) In any of pixels (A12)-(A14), the etch-stop layer has a dielectric constant $\kappa_S$, a thickness $t_S$, and an etch-stop capacitance $C_S$ that is proportional to $\kappa_S/t_S$, the low-κ dielectric has a dielectric constant $\kappa_L$, a thickness $t_L$, and a low-κ capacitance $C_L$ that is proportional to $\kappa_L/t_L$. The low-κ capacitance may be less than the etch-stop capacitance.

(A16) Pixel (A15) may further include an oxide layer lining the trench between the low-κ depth and the planar region and having a dielectric constant $\kappa_O$, a thickness $t_O$, and an oxide-layer capacitance $C_O$ that is proportional to $\kappa_O/t_O$ and greater than $(1/C_L + 1/C_S)^{-1}$.

(B1) An image sensor includes a plurality of any of the pixels of (A1)-(A15), for each pixel of the plurality of pixels, the semiconductor substrate thereof being part of a same semiconductor substrate of the image sensor.

(C1) A pixel fabrication method includes lining a surface of a trench with an etch-stop layer. The trench extends into a top surface of a semiconductor substrate and has a trench depth relative to a planar region of the top surface surrounding the trench. The semiconductor substrate includes a photodiode region located adjacent to the trench. The photodiode region is formed at a photodiode depth and extends away from the planar region. Relative to the planar region, the photodiode depth is less than the trench depth. The method also includes (a) partially filling the trench with a low-κ dielectric to a low-κ depth, with respect to the planar region, that is less than the trench depth; (b) removing the etch-stop layer between the low-κ depth and the planar region; and (c) depositing a dielectric layer on the surface of the trench at depths between the planar region and the low-κ depth.

(C2) Method (C1) may also include dry etching, with an etchant, the low-κ dielectric until a thickness of the low-κ dielectric equals a difference between the trench depth and the low-κ depth. An etch rate of the low-κ dielectric exceeds, for the etchant, an etch rate of the etch-stop layer.

(C3) In any one of methods (C1) and (C2), removing may include wet etching the etch-stop layer.

(C4) Any of methods (C1) through (C3) may further include, after partially filling, filling the trench with a gate electrode material between the low-κ depth and the planar region.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:
1. A pixel comprising:
   a semiconductor substrate having a substrate top surface forming a trench extending into the semiconductor substrate, the trench having a trench depth relative to a planar region of the substrate top surface surrounding the trench;
   a low-κ dielectric that (i) is in the trench between the trench depth and a low-κ depth that is less than the trench depth with respect to the planar region and (ii) being formed of a first material;
   an oxide layer lining the trench between the low-κ depth and the planar region, and being formed of a second material that differs from the first material;
   a photodiode region in the semiconductor substrate beginning at a photodiode depth that is less than the low-κ depth with respect to the planar region; and
   a gate-electrode material filling the trench between the low-κ depth and the planar region;
   the trench, the oxide layer, the low-K dielectric, and the gate-electrode material collectively forming a vertical transfer gate electrically connected to the photodiode region.

2. The pixel of claim 1, wherein:
   the oxide layer has a thickness, in a direction parallel to the planar region, that differs from a thickness of the low-κ dielectric, which equals a difference between the trench depth and the low-κ depth.

3. The pixel of claim 2, the oxide layer having a dielectric constant $\kappa_O$, a thickness $t_O$, and an oxide-layer capacitance proportional to $\kappa_O/t_O$, the low-κ dielectric having a dielectric constant $\kappa_L$, a thickness $t_L$, and a low-κ capacitance that is proportional to $\kappa_L/t_L$ and less than the oxide-layer capacitance.

4. A pixel comprising:
 a semiconductor substrate having a substrate top surface forming a trench extending into the semiconductor substrate, the trench having a trench depth relative to a planar region of the substrate top surface surrounding the trench;
 a low-κ dielectric in the trench between the trench depth and a low-κ depth that is less than the trench depth with respect to the planar region;
 a photodiode region in the semiconductor substrate beginning at a photodiode depth that is less than the low-κ depth with respect to the planar region;
 an etch-stop layer lining the trench between the low-κ dielectric and the semiconductor substrate and having an etch selectivity that exceeds an etch selectivity of the low-κ dielectric, each etch selectivity being relative to the semiconductor substrate; and a gate-electrode material filling the trench.

5. The pixel of claim 4, a thickness of the etch-stop layer being between one nanometer and twenty-one nanometers.

6. The pixel of claim 4, the etch-stop layer being a high-κ dielectric.

7. The pixel of claim 4, the etch-stop layer having a dielectric constant $\kappa_s$, a thickness $t_s$, and an etch-stop capacitance $C_s$ proportional to $\kappa_s/t_s$, the low-κ dielectric having a dielectric constant $K_L$, a thickness $t_L$, and a low-κ capacitance $C_L$ that is proportional to $\kappa_L/t_L$ and less than the etch-stop capacitance $C_s$.

8. The pixel of claim 7, further comprising:
 an oxide layer lining the trench between the low-κ depth and the planar region and having a dielectric constant $\kappa_O$, a thickness $t_O$, and an oxide-layer capacitance $C_O$ that is proportional to $\kappa_O/t_O$ exceeds $(1/C_L+1/C_s)^{-1}$.

9. The pixel of claim 4, further comprising:
 the gate-electrode material filling the trench between the low-κ depth and the planar region; and
 an oxide layer lining the trench between the low-κ depth and the planar region, the oxide layer including a section that (i) covers a top surface of the low-κ dielectric and (ii) is between the gate-electrode material and the top surface of the low-κ dielectric.

10. The pixel of claim 2,
 in the direction parallel to the planar region, the thickness of the oxide layer being between two nanometers and ten nanometers; and
 in the direction perpendicular to the planar region, the thickness of the low-κ dielectric being between ten nanometers and two-hundred nanometers.

\* \* \* \* \*